United States Patent
Margarit

(10) Patent No.: US 7,869,484 B2
(45) Date of Patent: Jan. 11, 2011

(54) TRANSMITTER APPARATUS WITH ADAPTIVE POWER AND PHASE FOR CDMA APPLICATIONS

(76) Inventor: Mihai Margarit, 5445 Sonoma Pl., San Diego, CA (US) 92130

( * ) Notice: Subject to any disclaimer, the term of this patent is extended or adjusted under 35 U.S.C. 154(b) by 767 days.

(21) Appl. No.: 11/909,721

(22) PCT Filed: May 22, 2006

(86) PCT No.: PCT/US2006/020077

§ 371 (c)(1),
(2), (4) Date: Sep. 26, 2007

(87) PCT Pub. No.: WO2006/127808

PCT Pub. Date: Nov. 30, 2006

(65) Prior Publication Data

US 2010/0183051 A1    Jul. 22, 2010

Related U.S. Application Data

(60) Provisional application No. 60/683,410, filed on May 23, 2005.

(51) Int. Cl.
*H04B 1/00* (2006.01)

(52) U.S. Cl. .................. 375/146; 375/130; 375/295; 375/296; 375/297; 375/301; 375/300; 455/126; 455/127.1; 455/127.2

(58) Field of Classification Search .............. 375/130, 375/146, 295, 296, 297, 301, 300; 455/126, 455/127.1, 127.2
See application file for complete search history.

(56) References Cited

U.S. PATENT DOCUMENTS

| | | |
|---|---|---|
| 5,230,088 A | 7/1993 | Kramer |
| 6,677,788 B2 | 1/2004 | Miyagawa |
| 2004/0219891 A1 | 11/2004 | Hadjichrstos |

FOREIGN PATENT DOCUMENTS

EP    1052823 A2    11/2000

*Primary Examiner*—Chieh M Fan
*Assistant Examiner*—Siu M Lee
(74) *Attorney, Agent, or Firm*—Merle W. Richman, Esq.

(57) ABSTRACT

A spread spectrum cellular network (FIG. 1) mobile unit transmitter (30) that enables communication via protocols having different bandwidth (372) and baseband signal generation (260), the transmitter including a phase locked loop and an amplitude control loop.

27 Claims, 6 Drawing Sheets

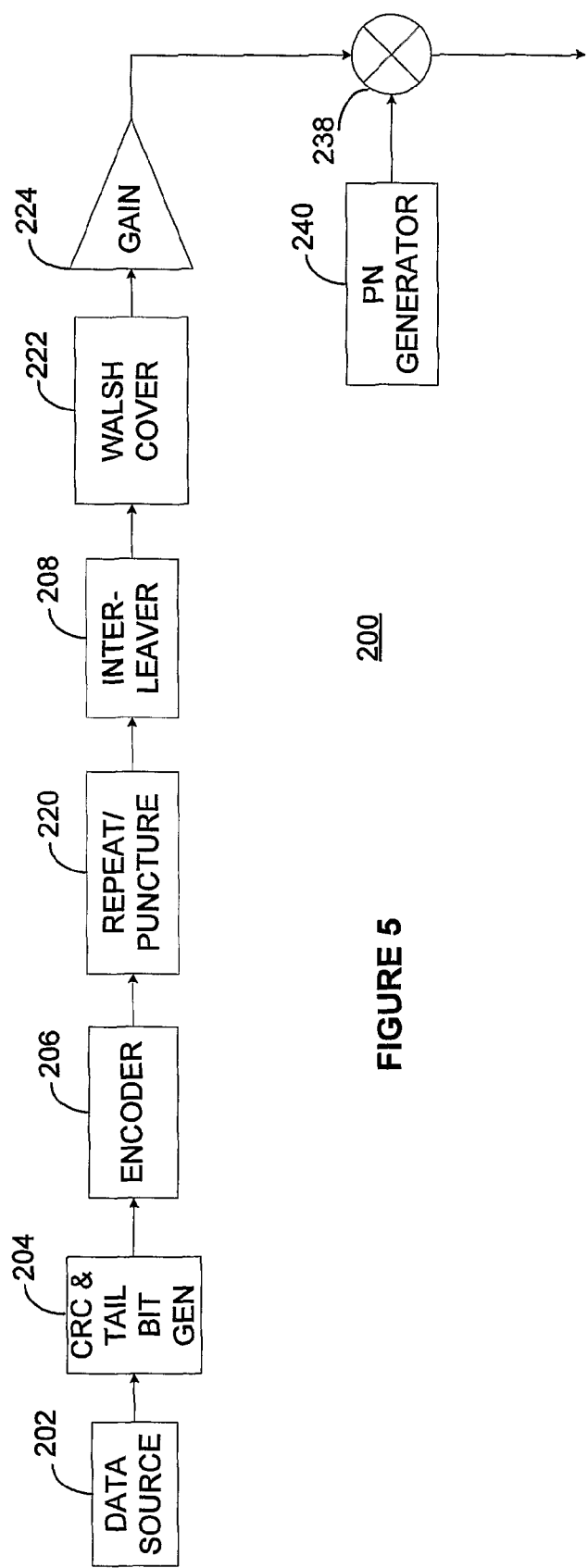
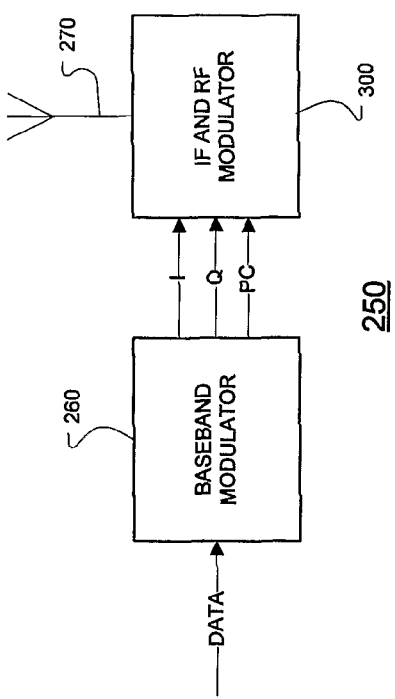
FIGURE 5
FIGURE 4

TRANSMITTER APPARATUS WITH ADAPTIVE POWER AND PHASE FOR CDMA APPLICATIONS

CROSS REFERENCE TO RELATED APPLICATIONS

The present application for patent claims priority to Patent Application No. 60/683,410 entitled "Transmit Modulator with Polar Loop for WCDMA and GSM/EDGE Applications," filed May 23, 2006, and hereby expressly incorporated by reference herein.

BACKGROUND

1. Field of the Invention

The invention relates generally to spread spectrum mobile communication networks, and more particularly, to a method and apparatus for generating an RF signal from a baseband signal for communication in a spread spectrum mobile cellular communication network.

2. Description of Related Art

In wireless radiotelephone communication systems, several users may communicate over one or more wireless channels. Communication over the wireless channels may employ a variety of multiple access techniques that enable multiple users to share limited frequency spectrum. These multiple access techniques may include time division multiple access (TDMA), frequency division multiple access (FDMA), and code division multiple access (CDMA).

An exemplary CDMA system is described in U.S. Pat. No. 4,901,307, entitled "SPREAD SPECTRUM MULTIPLE ACCESS COMMUNICATION SYSTEM USING SATELLITE OR TERRESTRIAL REPEATERS," issued Feb. 13, 1990, incorporated herein by reference. An exemplary CDMA system is further described in U.S. Pat. No. 5,103,459, entitled "SYSTEM AND METHOD FOR GENERATING SIGNAL WAVEFORMS IN A CDMA CELLULAR TELEPHONE SYSTEM," issued Apr. 7, 1992, and incorporated herein by reference.

As described in the above referenced patents, CDMA systems employ a forward-link (base station to mobile station) pilot signal. In typical CDMA wireless communication systems, such as that described in EIA/TIA IS-95, the pilot signal acts as a "beacon" transmitting a constant zero symbol, spread with the same pseudo-noise (PN) sequences used by the traffic bearing signals. The pilot signal may be covered with an all-zero Walsh sequence. During initial system acquisition, a mobile station may search through PN offsets to locate a base station's pilot signal. Once the mobile station has acquired the pilot signal, it may derive a stable phase and magnitude reference for coherent demodulation and modulation (transmission to the base station), such as that described in U.S. Pat. No. 5,764,687 entitled "MOBILE DEMODULATOR ARCHITECTURE FOR A SPREAD SPECTRUM MULTIPLE ACCESS COMMUNICATION SYSTEM," issued Jun. 9, 1998, and incorporated herein by reference.

In addition, mobile units may be required to transmit signals using one or more RF frequencies and related channels. In such networks mobile units generally have limited transmit power. In order to conserve power and prevent or reduce dropped calls each mobile unit should transmit precisely modulated signals (with stable phase and magnitude) to a base station. The present invention provides such a mobile unit based system transmitter.

SUMMARY OF THE INVENTION

The present invention includes a spread spectrum cellular network mobile unit transmitter that enables communication via protocols having different bandwidths and baseband signal generation, the transmitter including a phase locked loop and an amplitude control loop.

The transmitter may include an intermediate frequency that modulates a base-band ("BB"), spread spectrum signal to generate an IF signal. The transmitter may further include means for determining the phase component of the IF signal and means for determining the amplitude component of the IF signal. The transmitter may include means for generating a baseband frequency signal based on the IF signal phase component and a phase feedback signal. The transmitter may also include means for RF modulating the baseband frequency signal and means for amplitude modifying the RF modulated signal to generate a spread spectrum RF signal. The RF signal would correspond to the baseband, spread spectrum signal. In an embodiment the amplitude modification may be based on an amplitude feedback signal. In this embodiment the transmitter may include means for generating the amplitude feedback signal based on the spread spectrum RF signal and IF signal. The transmitter may also include means for generating the phase feedback signal based on the spread spectrum RF signal.

In an embodiment the means for determining the phase component may include a limiter and a phase-frequency detector. The IF modulator may include a gain control. In addition, the means for determining the amplitude component of the IF signal may include a peak detector. Further, the means for RF modulating the baseband frequency signal may include a voltage controlled oscillator ("VCO") and a divider. In an embodiment the means for amplitude modifying the RF modulated signal to generate a spread spectrum RF signal may include an RF variable gain amplifier ("VGA") and a power amplifier. In this embodiment the gain of the RF VGA and power amplifier may be modulated by the amplitude feedback signal. Further, the means for generating the phase feedback signal based on the spread spectrum RF signal may include a single side band ("SSB") mixer and limiter. In an embodiment the BB signal may have a bandwidth and the IF signal may have a carrier frequency that is at least ten times greater than the BB signal bandwidth. Further, the BB signal may have two, different bandwidths. Also, the BB signal may be generated using different encoding protocols.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIG. 4 is a simplified block diagram of an exemplary mobile unit or station signal modulator according to an embodiment of the present invention.

FIG. 5 is a functional block diagram of a forward link data formatter that may be used to practice the present invention.

DETAILED DESCRIPTION

Throughout this description, embodiments and variations are described for the purpose of illustrating uses and implementations of the invention. The illustrative description should be understood as presenting examples of the invention, rather than as limiting the scope of the invention.

Figure 1:
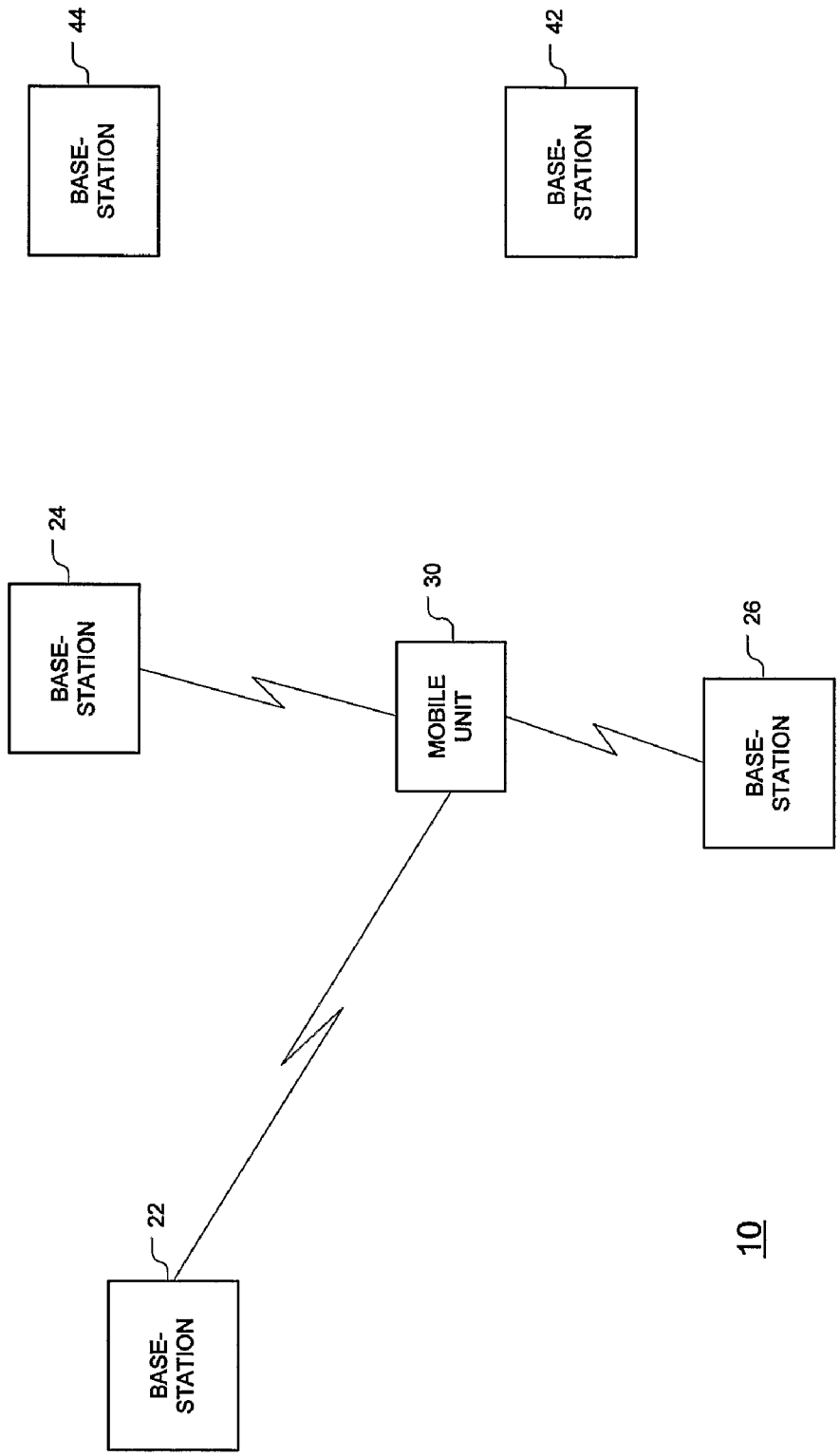
FIG. 1 is a block diagram of a cellular communication system comprising a plurality of base stations and mobile station that may practice the present invention.

FIG. 1 is a block diagram of a cellular system segment 10 in which the present invention may be employed. In this cellular system segment 10, there is a plurality of base stations 22, 24, 26, 42, and 44 that are geographically separated and a mobile unit 30. The mobile unit may be any wireless apparatus that includes a cellular Modulator/Demodulator ("modem") that may communicate with a base station ("BS") 22, 24, 26, 42, or 46. For example, the mobile unit may be a cellular telephone, personal data assistant ("PDA"), or computer. In one embodiment, each base station may communicate with the mobile unit when the signal strength of the mobile unit, as received at a base station, is sufficiently strong. In one invention embodiment, the base stations support the same wireless communication protocol standard (such as the CDMA IS2000 rev. C standard, WCDMA, and GSM/EDGE). In another embodiment of the invention, the base stations may support different or multiple communication protocol standards. In addition, the mobile unit 30 may support a single or multiple communication protocol standards. For example, the device 30 may support a CDMA standard, Advanced Mobile Phone Service ("AMPS") standard, a Time Division Multiple Access ("TDMA") standard, and a Groupe Spécial Mobile ("GSM") standard, Wideband Code Division Multiple Access ("WCDMA"), and Enhanced Data rate for GSM Evolution ("GSM/EDGE"). In the example shown in FIG. 1, the mobile unit 30 is capable of communicating with all of the base stations 22, 24, 26, 42, or 44 using a WCDMA and GSM/EDGE standard according to an embodiment of the present invention.

Figure 3:
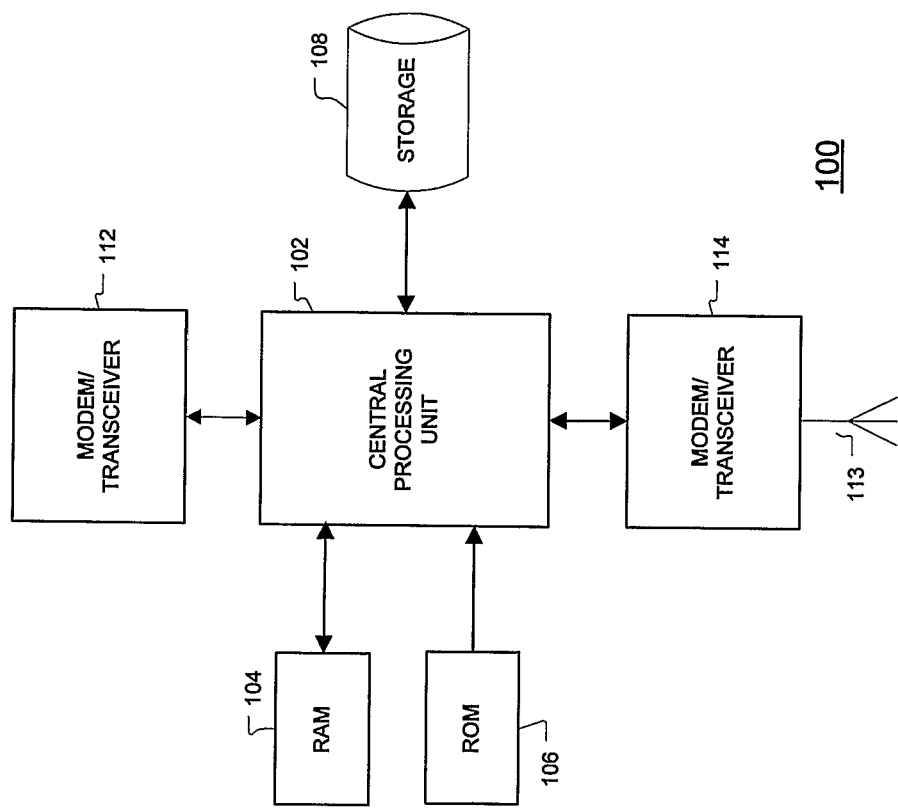
FIG. 3 is a block diagram of an exemplary base station that may be used in the present invention.

FIG. 3 illustrates a block diagram of an exemplary base station 100 that may be used in practicing the present invention. The exemplary base station 100 may include a CPU 102, a RAM 104, a ROM 106, a storage unit 108, a first modem/transceiver 112 and a second modem/transceiver 114. The first modem/transceiver 112 may couple, in a well-known manner, the base station 100 to a central cellular network control center via an Internet connection or via a wired telephone system such as the Plain Old Telephone System ("POTS"). The second modem/transceiver 114 couples the base station 100 to the cellular network segment 10. The modem/transceiver 114 may be an Ethernet modem, telephone modem, wireless modem or other communication device that communicates with the cellular network 10 (FIG. 1). The CPU 102 directs communications between the first and second modem, 112 and 114, respectively, for messages between the central network control center, Internet, or POTS, and one or more mobile units.

The ROM 106 may store program instructions to be executed by the CPU 102. The RAM 104 may be used to store temporary program information and overhead information for other base stations in its sector (i.e., nearby base stations). The storage unit 108 may comprise any convenient form of data storage and may be used to store the overhead information.

Figure 2:
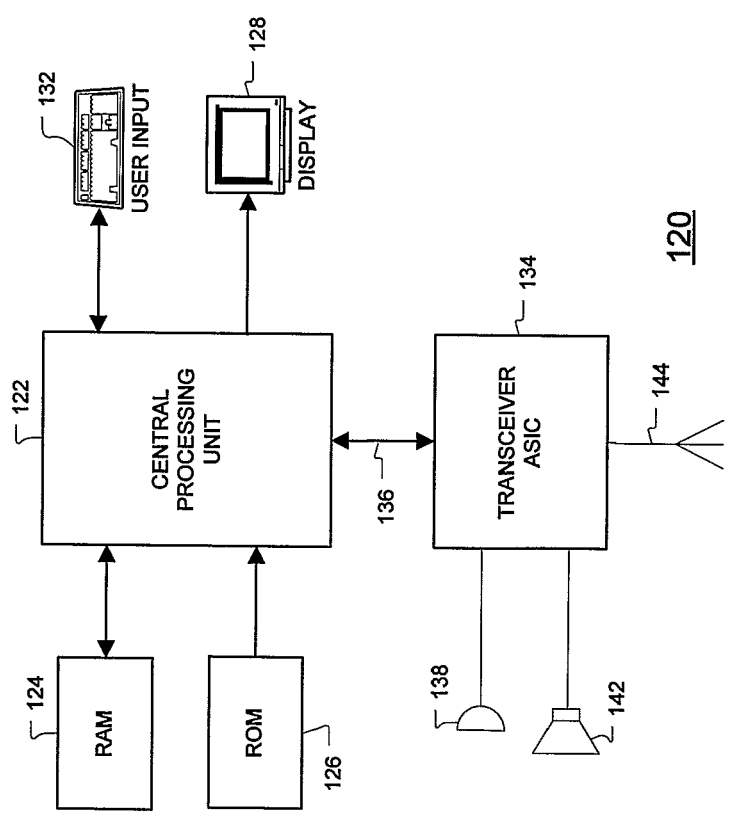
FIG. 2 is a block diagram of an exemplary mobile unit that may include an embodiment of the present invention.

FIG. 2 is a block diagram of an exemplary mobile unit 120 that may be used to practice the present invention. The exemplary device 120 may include a central processing unit ("CPU") 122, a random access memory ("RAM") 124, a read only memory ("ROM") 126, a display 128, a user input device 132, a transceiver application specific integrated circuit ("ASIC") 134, a microphone 138, a speaker 142, and an antenna 144. The ROM 126 is coupled to the CPU 122 and stores the program instructions executed by the CPU 122. The RAM 124 is coupled to the CPU 122 and stores temporary program data and overhead information. The user-input device 132 may comprise an input device such as a keypad, touch pad screen, track ball or other similar input device that allows the user to navigate through menus in order to place calls, in addition to performing other functions. The display 128 is an output device such as a CRT, LCD or other similar screen display that enables the user to read received data and to place calls.

The microphone 138 and speaker 142 may be incorporated into a handset that is coupled to the ASIC 134. The microphone 138 and speaker 142 may also be separated from the handset to allow hands-free communication. In this mode, the ASIC 134 may include voice activation circuitry that converts voice commands into data. The data is transmitted to the CPU 122 via a serial bus 136 and may include a telephone number to be dialed.

The transceiver ASIC 134 includes an instruction set necessary to communicate data and voice signals over the cellular network segment 10. In one embodiment, the transceiver ASIC 134 is a WCDMA and GSM/EDGE ASIC and the cellular network is a WCDMA or GSM/EDGE network that supports data and voice communication. The ASIC 134 is coupled to the antenna 144 to communicate signals within the cellular network segment 10. When a data signal is received by the transceiver ASIC 134, the data is transferred to the CPU 122 via a serial bus 136. The data can include base station overhead information to be stored by the mobile unit in accordance with the methods described herein.

The ASIC 134 may perform operations to determine the magnitude and phase of any base station pilot signals. The ASIC 134 may employ the determined pilot signal attributes when generating mobile RF signals. An exemplary portion of the ASIC 134 is shown in FIG. 4. As shown in FIG. 4, the exemplary ASIC 134 includes a baseband modulator 260, an IF and RF modulator 300, and an antenna 270. The baseband modulator converts data (that may be voice or digital data) into in-phase ("I") and quadrature ("Q") signals having a predetermined bandwidth (15 MHz for WCDMA and 2 MHz for GSM/EDGE). The baseband modulator may also provide a power control ("PC") signal where the PC signal may be generated from a base station received signal. The PC signal may indicate the mobile unit RF signal power level required or suggested by the base station. The IF and RF modulator 300 converts the baseband I and Q signal into an RF signal, the RF signal having a center frequency of 1800 MHz or 900 MHz in an embodiment. The antenna 270 radiates the generated RF signal for reception by a base station 22.

FIG. 5 is a functional block diagram of a typical forward link data formatter as used by a CDMA baseband modulator 260 is shown in FIG. 4. Data source 202 may be, for example, a variable rate vocoder such as that described in U.S. Pat. No. 5,657,420, entitled "VARIABLE RATE VOCODER," issued Aug. 8, 1997, and incorporated herein by reference. CRC and tail bit generator 204 calculates and appends cyclic redundancy check (CRC) bits and tail bits to the frames generated by data source 202. The frame is then provided to encoder 206, which provides forward error correction coding, such as convolutional encoding, upon the frame as is known in the art. The encoded symbols are provided to repetition generator 220, which repeats the reordered symbols to provide the appropriate modulation symbol rate. The repeated symbols are then provided to interleaver 208, which re-orders the symbols in accordance with a predetermined interleaver format. The repeated, interleaved symbol stream is then covered with a set of orthogonal Walsh sequences in the Walsh coverer 222, and gain adjusted in gain element 224. It should be understood that other forward link data formatters are also known in the art. For example, it is well known that the repetition generator 220 may be placed after the interleaver 208. The data is then spread in PN spreader 238 using a complex PN code generated by PN generator 240.

In spread spectrum mobile cellular communication networks (such as WCDMA systems), the signal power level between base stations and mobile units is carefully controlled. For example in WCDMA mobile communication system versions, a mobile unit calculates the channel quality of a signal transmitted from the base station and periodically reports this measured channel quality to the base station. The base station may then adjust the gain of future transmissions to the reporting mobile unit accordingly. In addition, the mobile unit may determine and report the channel quality of pilot signals received from other base stations. Depending on the reported channel quality of other pilot signals, communication between the mobile unit and another base station may be established.

Figure 6:
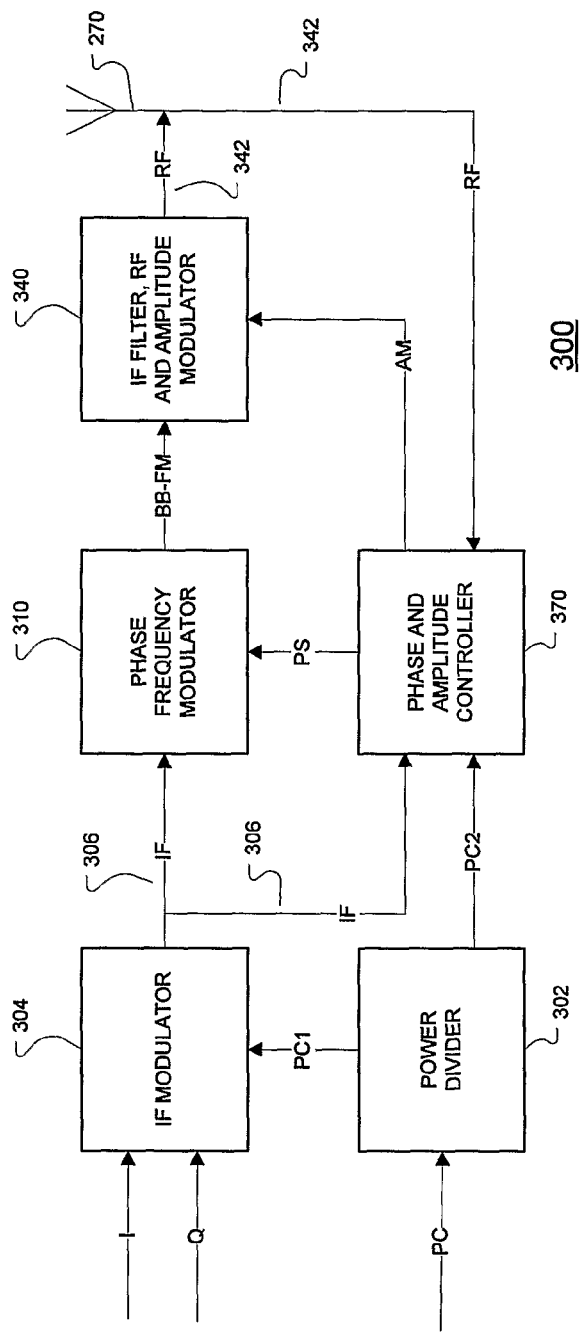
FIG. 6 is a simplified block diagram of an exemplary mobile unit or station signal IF and RF modulator according to an embodiment of the present invention.

GSM/EDGE systems have different power concerns. In an embodiment the mobile station or unit 30 may communicate with a base station 22 via GSM/EDGE protocols or WCDMA protocols. The mobile station 30 transmitter 250 may need to employ strict power controls to enable multiple protocol transmission capability. FIG. 6 is a simplified block diagram of an exemplary mobile unit or station signal IF and RF modulator 300 according to an embodiment of the present invention. In an embodiment the modulator 300 controls the power level and frequency of the generated RF signal 342 by treating the modulated IF signal 306 as a polar signal (amplitude and phase based) signal. The modulator 300 actively controls the amplitude (power level) and phase (frequency) of the generated RF signal 342 via a closed loop or feedback loop for the amplitude and phase (independent). The modulator 300 supports GSM/EDGE and WCDMA protocols by treating the underlying signal as an amplitude and phase modulated signal versus multi-channel, I and Q, or GSM formatted signals.

As shown in FIG. 6 the IF and RF modulator 300 includes an IF modulator 304, power divider 302, phase frequency modulator ("PFM") 310, IF Filter, RF and Amplitude Modulator ("FRAM") 340, antenna 270, and phase and amplitude controller ("PAC") 370. In WCMDA applications the required power control range may be about 75 dB whereas in GSM/EDGE applications the required power control range may be about 30 dB. In an embodiment the power divider 302 enables 75 dB of power control range by dividing a power control ("PC") signal into a PC1 signal having a 45 dB range and a PC2 signal having a 30 dB range. In an embodiment the PC1 signal is only used for WCMDA applications. The PC2 may be used in both GSM/EDGE and WCDMA applications.

In an embodiment the IF modulator 304 has a gain range of 45 dB and adjusts the IF signal 306 gain based on the received PC1 signal. In addition in an embodiment the IF signal may have a center frequency of about 450 MHz where WCMDA applications have a 15 Mhz bandwidth and GSM/EDGE applications have a 2 MHz bandwidth and the RF signal center frequency is about 900 MHz or 1800 MHz. The relatively high (as compared to the underlying modulated signal bandwidths of 2 MHz or 15 MHz) IF center frequency enables the IF and RF modulator to provide better cancellation of the phase nonlinearities in the phase modulation path. Ideally the IF center frequency is at least tens greater than the application modulated signal bandwidth (15 MHz for WCDMA and 2 MHz for GSM/EDGE).

The IF signal 306 is provided to the PFM 310 and the PAC 370. The PFM 310 extracts the frequency component of the IF signal 306 and modulates the IF signal 306 frequency component via a feedback component, Phase Signal ("PS") generated by the PAC 370. The PFM 310 provides the IF Frequency Modulated ("IF-FM") signal to the FRAM 340. The PAC determines the PS signal and a corresponding amplitude modulation "AM" signal based on the IF signal 306 and RF signal 342 based on the polar based evaluation of the IF and RF signals 306 and 342. As noted the polar based evaluation enables the invention 300 to use similar processing techniques regardless of the underlying signal modulation (WCMDA, CDMA, TDMA, GSM, GSM/EDGE). The AM signal provides the amplitude component of the IF signal to the FRAM 340.

Figure 7:
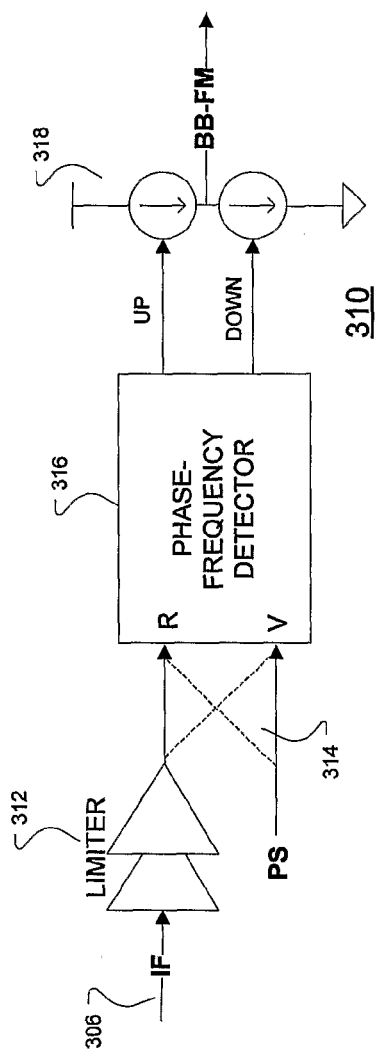
FIG. 7 is a simplified block diagram of an exemplary mobile unit or station signal phase frequency modulator according to an embodiment of the present invention.

The FRAM 340 receives the IF-FM signal and the AM signal. The FRAM band-pass filters and shifts the IF-FM signal to RF and amplitude modulates the RF signal via the AM signal to generate the RF signal 342 where the RF signal 342 corresponds to the IF signal 306 shifted to RF and corrected for phase (frequency) and amplitude (power) deviations. FIG. 7 is a simplified block diagram of an exemplary mobile unit or station signal PFM 310 according to an embodiment of the present invention.

The PFM 310 includes a limiter 312, switch 314, phase frequency detector ("PFD") 316, and charge pump 318. The limiter 312 receives the IF signal 306 and amplitude limits the signal to effectively remove the amplitude component of the polar signal (as modeled in the invention). The resulting frequency or phase modulated signal is input to the switch 314. In an embodiment the switch 314 may flip the limited IF signal and PS as the R and V signals of the PFD 316 based on the RF selected, i.e., 900 MHz or 1800 MHz. In combination with the charge pump 318, the PFD 316 produces a baseband frequency modulated signal (BB-FM) that is provided to the FRAM 340.

Figure 8:
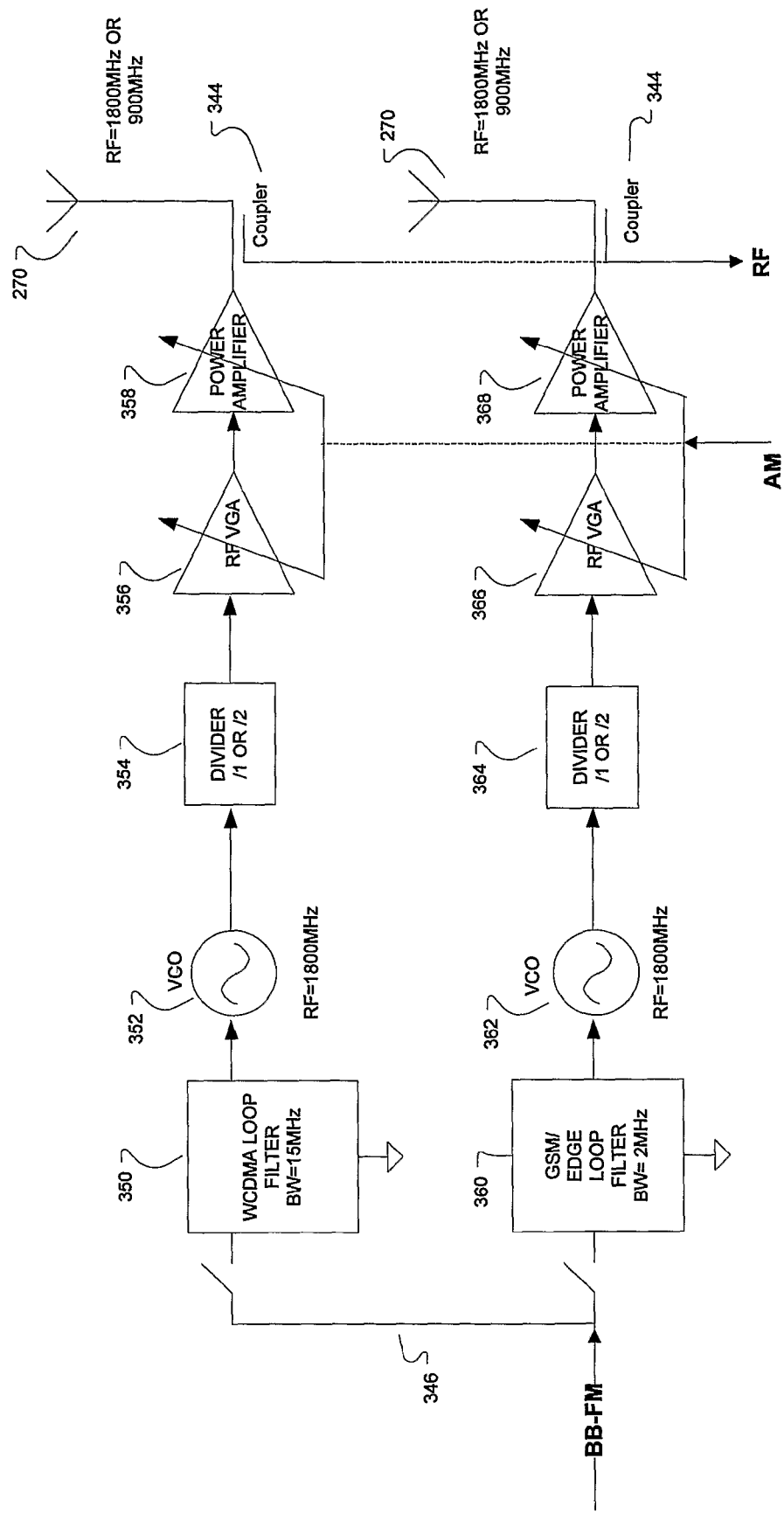
FIG. 8 is a simplified block diagram of an exemplary mobile unit or station signal IF filter and RF and amplitude modulator according to an embodiment of the present invention.

FIG. 8 is a simplified block diagram of an exemplary mobile unit or station signal FRAM 340 according to an embodiment of the present invention. The FRAM 340 includes a switch 346, a coupler 344, an antenna 270, a WCDMA loop filter 350, a voltage controller oscillator ("VCO") 352, a divider 354, a RF variable gain amplifier ("VGA") 356, a power amplifier 358, a GSM/EDGE loop filter 360, a VCO 362, a divider 364, a RF VGA 366, and a power amplifier 368. The FRAM has two paths 350, 352, 354, 356, 358 and 360, 362, 364, 366, 368 for WCDMA applications (components 350, 352, 354, 356, and 358) and GSM/EDGE applications (360, 362, 364, 366, and 368). The switch 346 transmits the BB-FM signal to the appropriate path based on the active application (WCDMA or GSM/EDGE).

The WDCMA loop filter 350 has a 15 MHz filter and the GSM/EDGE loop filter 360 has a 2 MHz filter. The filters remove aliased frequency components in the BB-FM signal. The VCOs 352 and 362 shift the base band signal to RF, 1800 MHz in an embodiment. The divider 354, 364 may be reduce the RF frequency to 900 MHz (in an embodiment) when selected as the RF operating frequency. The RF VGA 356, 366, and power amplifier 358, 368 affect the amplitude of the RF signal where the RF VGA and power amplifier is modulated by the AM signal. The resultant RF, amplitude modified signal is radiated by antenna 270. In an embodiment a coupler 344 transmits the RF signal to the PAC 370.

Figure 9:
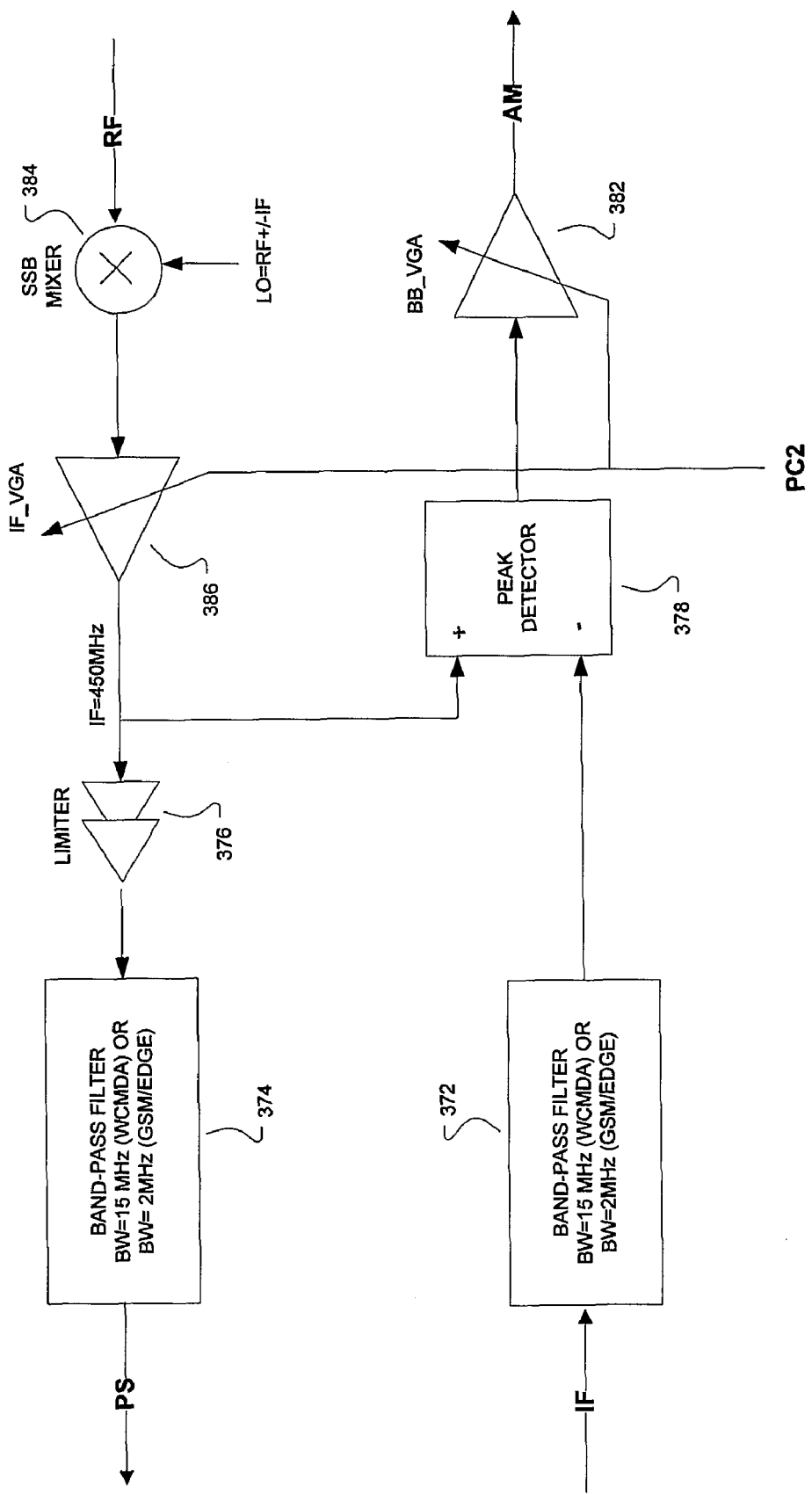
FIG. 9 is a simplified block diagram of an exemplary mobile unit or station signal phase and amplitude controller according to an embodiment of the present invention.

FIG. 9 is a simplified block diagram of an exemplary mobile unit or station signal PAC 370 according to an embodiment of the present invention. The PAC 370 includes a band-pass filter 372, a band-pass filter 374, a limiter 376, a peak detector 378, a baseband ("BB") VGA 382, a Single Side-Band ("SSB") Mixer 384, and an IF VGA 386. The PAC 370 receives the RF signals 342 and IF signals 306 and generates the PS signal and AM signal (the PS signal used by the PFM 310 and the AM used by the FRAM 340). In an embodiment the IF signal 306 is band pass filtered by the filter 372. The filter 372 employs a 15 MHz band for WCDMA applications and 2 MHz for GSM/EDGE applications since it will be compared to a single side band IF signal as described below. The band-passed IF signal is input to the peak detector 378.

The RF signal 342 is downshifted to a single sideband IF signal (signal bandwidth of 15 MHz or 2 MHz versus 30 MHz or 4 MHz for double sideband IF signals) via the SSB mixer 384. The local oscillator ("LO") frequency is set to 1350 or 450 when the RF signal has a carrier frequency of 1800 and 900 respectively. The resultant SSB IF signal is gain modified by the IF VGA 386. The IF VGA 386 adjusts the gain of the SSB IF based on the PC2 signal. The resultant gain adjusted SSB IF signal is compared to the band passed IF signal via the peak detector 378. The resultant peak-detected signal is a base band, amplitude modulated signal. The BB AM signal is gain adjusted by the BB VGA 382 to produce the AM signal, which is provided to the FRAM 340. The BB VGA 382 gain is also set by the PC2 signal.

The SSB, gain adjusted IF signal is also processed by the limiter 376. Similar to the limiter 312, the limiter 376 effectively removes any amplitude modulation present in the IF signal to produce a BB phase modulated ("PM") signal. The BB PM signal is band pass filtered by the filter 374. The filter 374 employs a 15 MHz band for WCDMA applications and 2 MHz for GSM/EDGE applications since it is applied to a BB signal. The resultant signal PS is transmitted to the PFM 310.

In summary, the present invention provides a dual mode transmitter that can be configured for WCDMA or GSM/EDGE modulation modes. The techniques employed by the invention may work for single band or channel and multi-band or multi-channel BB signals operation. In an embodiment the present invention 300 may be used in WCDMA mode at 900 MHz or 1800 MHz, or in GSM/EDGE mode at 900 MHz or 1800 MHz. The IF and RF modulator ("IRM") 300 employs two feedback loops: a phase locked loop and an amplitude control loop.

In an embodiment the IRM 300 phase locked loop includes the following components: the Phase Frequency Modulator 310, FRAM 340, and SSB Mixer 384, IF VGA 386, Limiter 376, and Band-Pass-Filter 374 of the PAC 370. The loop bandwidth for the phase locked loop is 15 MHz for WCDMA mode and 2 MHz for GSM/EDGE mode. Switch 346 of the FRAM 340 selects the WCDMA or the GSM/EDGE mode of operation respectively.

The amplitude control loop includes the following components: RF VGA (356—WCDMA; 366—GSM/EDGE) and Power Amplifier (358—WCDMA; 368—GSM/EDGE) of the FRAM 340, the SSB Mixer 384, the IF VGA 386, the Peak Detector 378, the Band-Pass filter 372, and the BB VGA 382 of the PAC 370. It is noted that the gain of the BB VGA 382 is the inverse of the gain of the IF VGA 386 in order to maintain constant loop gain for the amplitude control loop.

The previous description of the preferred embodiments is provided to enable any person skilled in the wireless communications art to make or use the present invention. The various modifications to these embodiments will be readily apparent to those skilled in the art, and the generic principles defined herein may be applied to other embodiments without the use of inventive faculty. Thus, the present invention is not intended to be limited to the embodiments shown herein, but is to be accorded the widest scope consistent with the principles and novel features disclosed herein.

While this invention has been described in terms of a best mode for achieving this invention's objectives, it will be appreciated by those skilled in the wireless communications art that variations may be accomplished in view of these teachings without deviating from the spirit or scope of the present invention. For example, the present invention may be implemented using any combination of computer programming software, firmware or hardware. As a preparatory step to practicing the invention or constructing an apparatus according to the invention, the computer programming code (whether software or firmware) according to the invention will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the computer programming code is used by either executing the code directly from the storage device, by copying the code from the storage device into another storage device such as a hard disk, RAM, etc., or by transmitting the code on a network for remote execution.

What is claimed is:

1. A cellular network mobile unit transmitter for generating an RF signal, comprising:
   an intermediate frequency ("IF") modulator that modulates a base-band ("BB") signal to generate an IF signal;
   means for determining the phase component of the IF signal;
   means for determining the amplitude component of the IF signal;
   means for generating a baseband frequency signal based on the IF signal phase component and a phase feedback signal;
   means for RF modulating the baseband frequency signal;
   means for amplitude modifying the RF modulated signal to generate the RF signal corresponding to the baseband signal, the amplitude modification based on an amplitude feedback signal;
   means for generating the phase feedback signal based on the RF signal including a single side band ("SSB") mixer, a variable gain amplifier, and a limiter; and
   means for generating the amplitude feedback signal receives a filtered IF signal and an output of the variable gain amplifier.

2. The transmitter of claim 1, wherein the means for determining the phase component includes a limiter and a phase-frequency detector.

3. The transmitter of claim 1, wherein IF modulator includes gain control.

4. The transmitter of claim 1, wherein the means for determining the amplitude component of the IF signal includes a peak detector.

5. The transmitter of claim 4, wherein the means for RF modulating the baseband frequency signal includes a voltage controlled oscillator ("VCO") and a divider.

6. The transmitter of claim 5, wherein the means for amplitude modifying the RF modulated signal to generate the RF signal includes an RF variable gain amplifier ("VGA") and a power amplifier, the gain of the RF VGA and the power amplifier modulated by the amplitude feedback signal.

7. The transmitter of claim 6, wherein the BB signal has a bandwidth and the IF signal has a carrier frequency that is at least ten times greater than a bandwidth of the BB signal.

8. The transmitter of claim 7, wherein the BB signal has two, different bandwidths.

9. The transmitter of claim 8, wherein the BB signal is generated using one of two different encoding protocols.

10. A method of generating a cellular network mobile unit RF signal, comprising:
   generating an intermediate frequency ("IF") signal from a base-band ("BB") signal;
   determining the phase component of the IF signal;
   determining the amplitude component of the IF signal;
   generating a baseband frequency signal based on the IF signal phase component and a phase feedback signal;
   RF modulating the baseband frequency signal;
   amplitude modifying the RF modulated signal to generate the RF signal corresponding to the baseband signal, the amplitude modification based on an amplitude feedback signal;
   employing a single side band ("SSB") mixer, a variable gain amplifier, and limiter to generate the phase feedback signal based on the RF signal; and
   generating the amplitude feedback signal based on a comparison of an output of the variable gain amplifier and a filtered IF signal.

11. The method of claim 10, wherein determining the phase component includes employing a limiter and a phase-frequency detector.

12. The method of claim 10, generating the intermediate frequency ("IF") signal from the base-band ("BB") signal to generate the IF signal subject to gain control.

13. The method of claim 10, wherein determining the amplitude component of the IF signal includes employing a peak detector.

14. The method of claim 13, wherein RF modulating the baseband frequency signal includes employing a voltage controlled oscillator ("VCO") and a divider.

15. The method of claim 14, wherein amplitude modifying the RF modulated signal to generate the RF signal includes employing an RF variable gain amplifier ("VGA") and a power amplifier and modulating the gain of the RF VGA and the power amplifier by the amplitude feedback signal.

16. The method of claim 15, wherein the BB signal has a bandwidth and generating the intermediate frequency ("IF") signal from the base-band ("BB") signal to generate the IF signal subject to gain control carrier frequency where the carrier frequency is at least ten times greater than a bandwidth of the BB signal.

17. The method of claim 16, wherein the BB signal has two, different bandwidths.

18. The method of claim 17, wherein the BB signal is generated using one of two different encoding protocols.

19. An article of manufacture for use in generating a cellular network mobile unit RF signal, the article of manufacture comprising non-transitory computer readable storage media including program logic embedded therein that causes control circuitry to perform:
   generating an intermediate frequency ("IF") signal from a base-band ("BB") signal;
   determining the phase component of the IF signal;
   determining the amplitude component of the IF signal;
   generating a baseband frequency signal based on the IF signal phase component and a phase feedback signal;
   RF modulating the baseband frequency signal;
   amplitude modifying the RF modulated signal to generate the RF signal corresponding to the baseband signal, the amplitude modification based on an amplitude feedback signal;
   employing a single side band ("SSB") mixer, a variable gain amplifier, and limiter to generate the phase feedback signal based on the RF signal; and
   generating the amplitude feedback signal based on a comparison of an output of the variable gain amplifier and a filtered IF signal.

20. The article of manufacture of claim 19, wherein determining the phase component includes employing a limiter and a phase-frequency detector.

21. The article of manufacture of claim 19, generating the intermediate frequency ("IF") signal from a base-band ("BB") signal to generate the IF signal subject to gain control.

22. The article of manufacture of claim 19, wherein determining the amplitude component of the IF signal includes employing a peak detector.

23. The article of manufacture of claim 22, wherein RF modulating the baseband frequency signal includes employing a voltage controlled oscillator ("VCO") and a divider.

24. The article of manufacture of claim 23, wherein amplitude modifying the RF modulated signal to generate the RF signal includes employing an RF variable gain amplifier ("VGA") and a power amplifier and modulating the gain of the RF VGA and the power amplifier by the amplitude feedback signal.

25. The article of manufacture of claim 24, wherein the BB signal has a bandwidth and generating the intermediate frequency ("IF") signal from a base-band ("BB") signal to generate the IF signal subject to gain control carrier frequency where the carrier frequency is at least ten times greater than a bandwidth of the BB signal.

26. The article of manufacture of claim 25, wherein the BB signal has two, different bandwidths.

27. The article of manufacture of claim 26, wherein the BB signal is generated using one of two different encoding protocols.

* * * * *